US007525810B2

(12) United States Patent
Jiang et al.

(10) Patent No.: US 7,525,810 B2
(45) Date of Patent: Apr. 28, 2009

(54) CONNECTOR FIXING STRUCTURE AND ELECTRONIC APPARATUS

(75) Inventors: Haiyong Jiang, Hanzhong (CN); Ruixin Yu, Hanzhong (CN); Liming Xu, Hanzhong (CN)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/146,341

(22) Filed: Jun. 25, 2008

(65) Prior Publication Data

US 2009/0004894 A1 Jan. 1, 2009

(30) Foreign Application Priority Data

Jun. 29, 2007 (CN) ........................ 2007 1 0129029
Sep. 28, 2007 (JP) ............................ 2007-256473

(51) Int. Cl.
*H05K 5/00* (2006.01)

(52) U.S. Cl. ....................... 361/752; 439/76.1; 439/562

(58) Field of Classification Search ................. 361/752, 361/736; 439/76.1, 607, 562, 574
See application file for complete search history.

(56) References Cited

U.S. PATENT DOCUMENTS 5,091,826 A * 2/1992 Arnett et al. ................ 361/776
5,105,095 A * 4/1992 Rudy et al. .................... 307/17
6,042,392 A * 3/2000 Tsuji .......................... 439/76.1
6,707,678 B2 * 3/2004 Kobayashi et al. .......... 361/752
6,950,311 B1 * 9/2005 DeCesare et al. ........... 361/727
7,140,885 B2 11/2006 Kitamura

FOREIGN PATENT DOCUMENTS

JP 8-274479 10/1996
JP 2000223856 8/2000

* cited by examiner

*Primary Examiner*—Phuong K Dinh
(74) *Attorney, Agent, or Firm*—Blakely, Sokoloff, Taylor & Zafman LLP

(57) ABSTRACT

According to one embodiment, a connector fixing structure includes a printed circuit board assembly, and a base to which the printed circuit board assembly is attached. The printed circuit board assembly has a connector mounted on a printed circuit board, and a connector panel attached to the printed circuit board. The connector has a connector main body, a front flange projecting from the connector main body, and a rear flange projecting from the connector main body. The connector panel has a provisional fixing portion which is inserted between the front flange and the rear flange and provisionally fixes the connector to the connector panel. The base has a fixing portion which is inserted between the rear flange and the connector panel, thereby brings the front flange into contact with the connector panel and fixes the connector to the base, when the printed circuit board assembly is attached to the base.

18 Claims, 8 Drawing Sheets

CONNECTOR FIXING STRUCTURE AND ELECTRONIC APPARATUS

CROSS-REFERENCE TO RELATED APPLICATIONS

This application is based upon and claims the benefit of priority from Chinese Patent Application No. 200710129029. X, filed Jun. 29, 2007, and Japanese Patent Application No. 2007-256473, filed Sep. 28, 2007, the entire contents of which are incorporated herein by reference.

BACKGROUND

1. Field

One embodiment of the invention relates to a structure for fixing a connector to, for example, a base of an electronic apparatus. Further, one embodiment of the invention relates to an electronic apparatus having a printed circuit board assembly to which a connector is provisionally fixed and a base to which the printed circuit board assembly is attached.

2. Description of the Related Art

Docking stations, which are used for expanding functions of portable computers, have a plurality of interface connectors and a plurality of slots. For example, various external peripheral equipments such as external storages, external displays having a large screen, external keyboards, printers and scanners can connect to the docking station through the interface connectors and slots.

The docking station includes a base, a top cover, and a printed circuit board assembly (hereinafter referred to as a "PCB assembly"). The PCB assembly has a printed circuit board, a power supply connector, a connector panel, a shield base, and a shield cover. The power supply connector is mounted on the printed circuit board. The power supply connector includes a box-shaped connector main body, a rear flange, a front flange, and a plug hole into which the power supply plug is inserted.

The front flange and the rear flange project from a peripheral surface of the connector main body. The front flange is positioned at one end of the connector main body, and opposed to the rear flange. A gap is provided between the front flange and the rear flange.

The power supply connector having the above structure is fixed in a groove, which is formed in a sidewall of the base or the top cover. Specifically, when the base is combined with the top cover, a portion of the connector main body between the front flange and the rear flange enters the groove. Thereby, the power supply connector is fixed into the groove. For example, Jpn. Pat. Appln. KOKAI Pub. No. 8-274479 discloses a converter having a code holding structure similar to the above fixing structure for the power supply connector.

In conventional power supply connectors, the other end of the connector main body is connected to the printed circuit board through a cable. Therefore, one end of the connector main body, which has the front and rear flanges, may freely move.

The cable connected to the connector main body is generally short and has elasticity and flexibility. Therefore, when a portion of the connector main body between the front and rear flanges is inserted into the groove, the cable may prevent assembly work and fixing work of the power supply connector, and causes inconvenience to work.

Further, an end portion of the cable may be disconnected from the printed circuit board or broken during work. As a result, stability of the connection line and reliability of electrical connection decrease.

In addition, according to the above structure, generally, a gap exists between the groove and the front and rear flanges. Therefore, when the power supply plug is connected to the power supply connector, the power supply connector may move forward or backward. As a result, the power supply plug cannot be stably connected to the power supply connector.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a connector fixing structure comprises: a printed circuit board assembly having a connector mounted on a printed circuit board, and a connector panel attached to the printed circuit board; and a base to which the printed circuit board assembly is attached. The connector has a connector main body, a front flange projecting from a peripheral surface of the connector main body, and a rear flange projecting from the peripheral surface of the connector main body and being opposed to the front flange. The connector panel has a provisional fixing portion which is inserted between the front flange and the rear flange and provisionally fixes the connector to the connector panel. The base has a fixing portion which is inserted between the rear flange and the connector panel, thereby brings the front flange into contact with the connector panel and fixes the connector to the base, when the printed circuit board assembly is attached to the base.

An embodiment of the present invention will be described below with reference to FIGS. 1 to 15.

Figure 1:
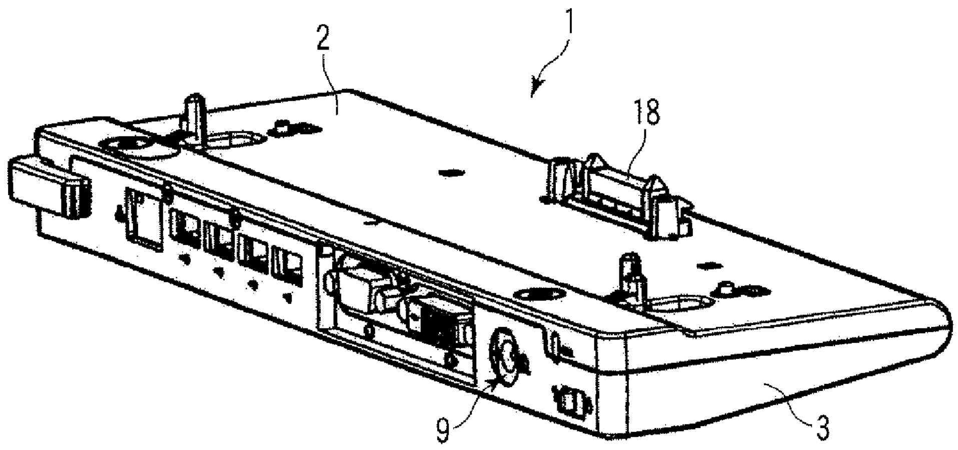
FIG. 1 is an exemplary perspective view of a docking station to which a connector fixing structure of the present invention is applied.
Figure 2:
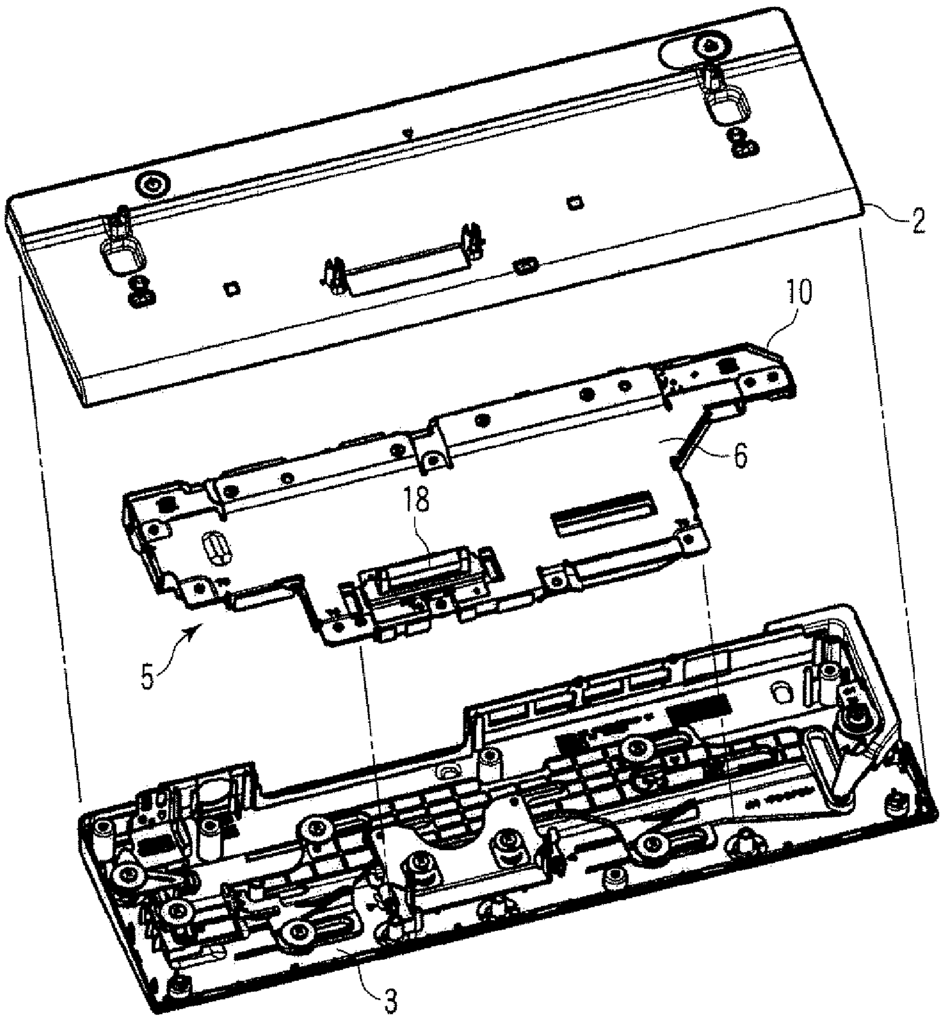
FIG. 2 is an exemplary exploded perspective view of the docking station, illustrating a positional relationship between a cover, a base, and a PCB assembly.

FIG. 1 is a perspective view illustrating a docking station, to which a connector fixing structure of the present invention is applied, in a three-dimensional manner. FIG. 2 is a perspective view illustrating main constituent elements of the docking station of the present invention in a three-dimensional manner.

As illustrated in FIGS. 1 and 2, a docking station 1 being an example of an electronic apparatus has a cover 2, a base 3, and a printed circuit board assembly 5 (hereinafter referred to as a "PCB assembly 5"). The PCB assembly 5 is contained between the cover 2 and the base 3.

Figure 3:
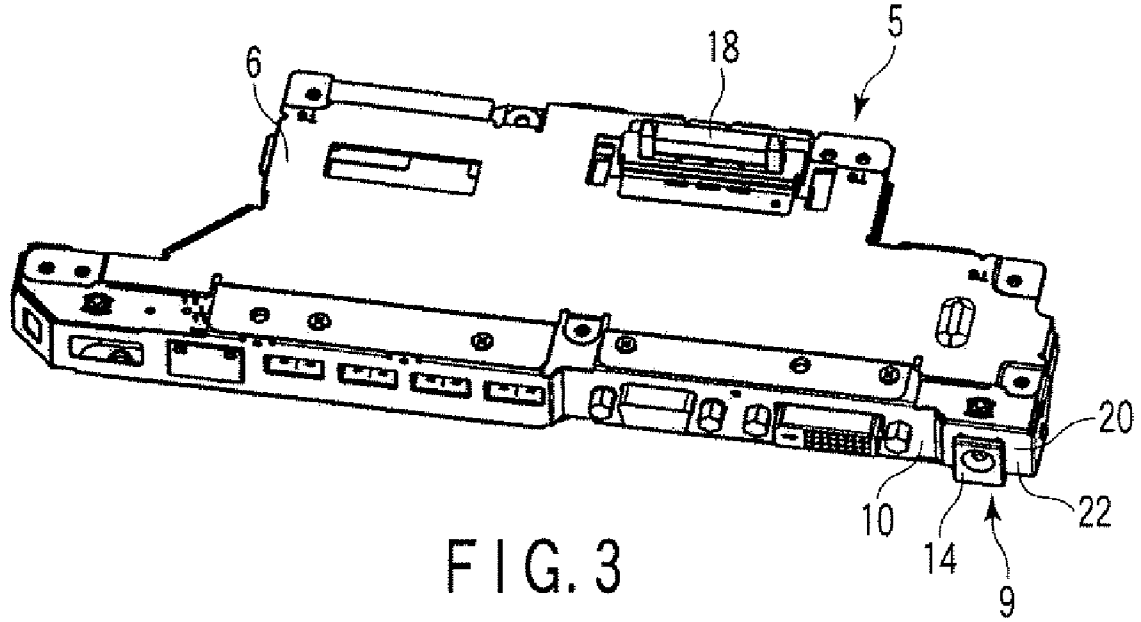
FIG. 3 is an exemplary perspective view of the PCB assembly illustrated in FIG. 2, as viewed from the top.
Figure 4:
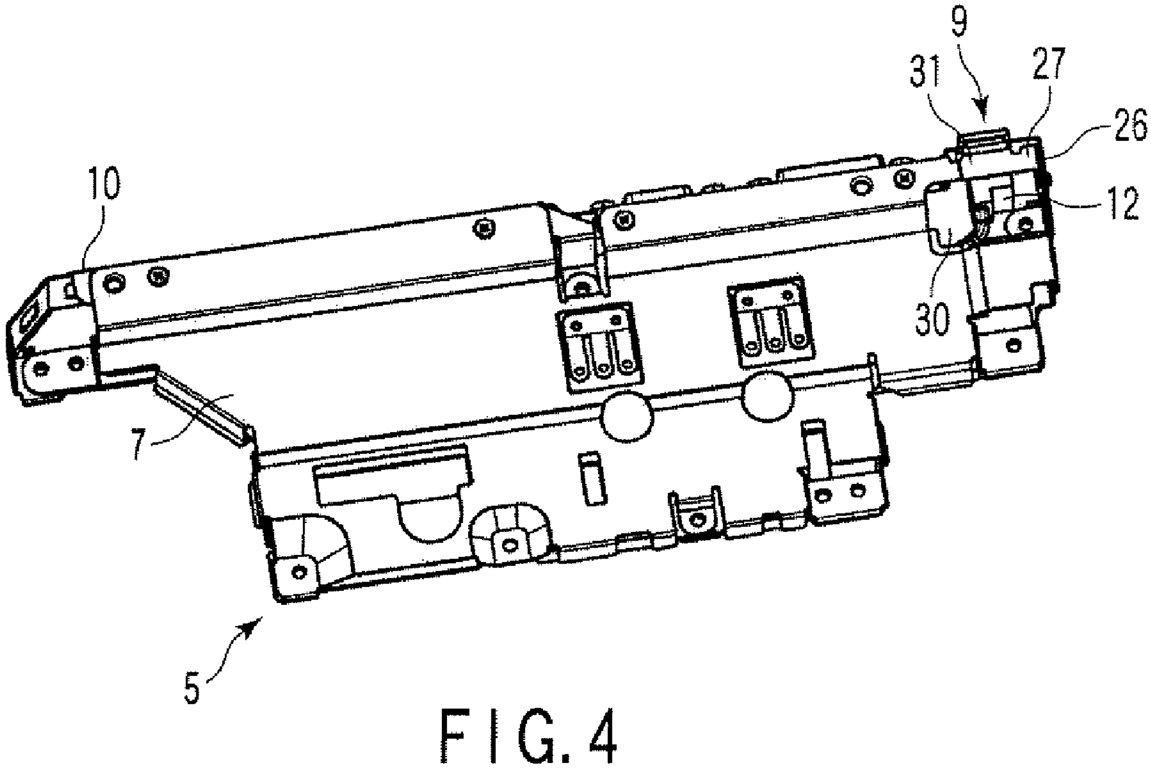
FIG. 4 is an exemplary perspective view of the PCB assembly illustrated in FIG. 2, as viewed from the bottom.

FIG. 3 is a perspective view of the PCB assembly 5 of FIG. 2 as viewed from the top, and FIG. 4 is a perspective view of the PCB assembly 5 of FIG. 2 as viewed from the bottom. FIGS. 5 to 8 are diagrams illustrating respective main constituent elements of the PCB assembly 5 illustrated in FIG. 5.

As illustrated in FIGS. 3 to 8, the PCB assembly 5 has a shield cover 6, a shield base 7, a printed circuit board 8, a power supply connector 9, and a connector panel 10. The connector panel 10 is attached to one end of the printed circuit board 8. The shield base 7 is attached to the bottom of the printed circuit board 8. The shield cover 6 is attached to the top of the printed circuit board 8.

Figure 9:
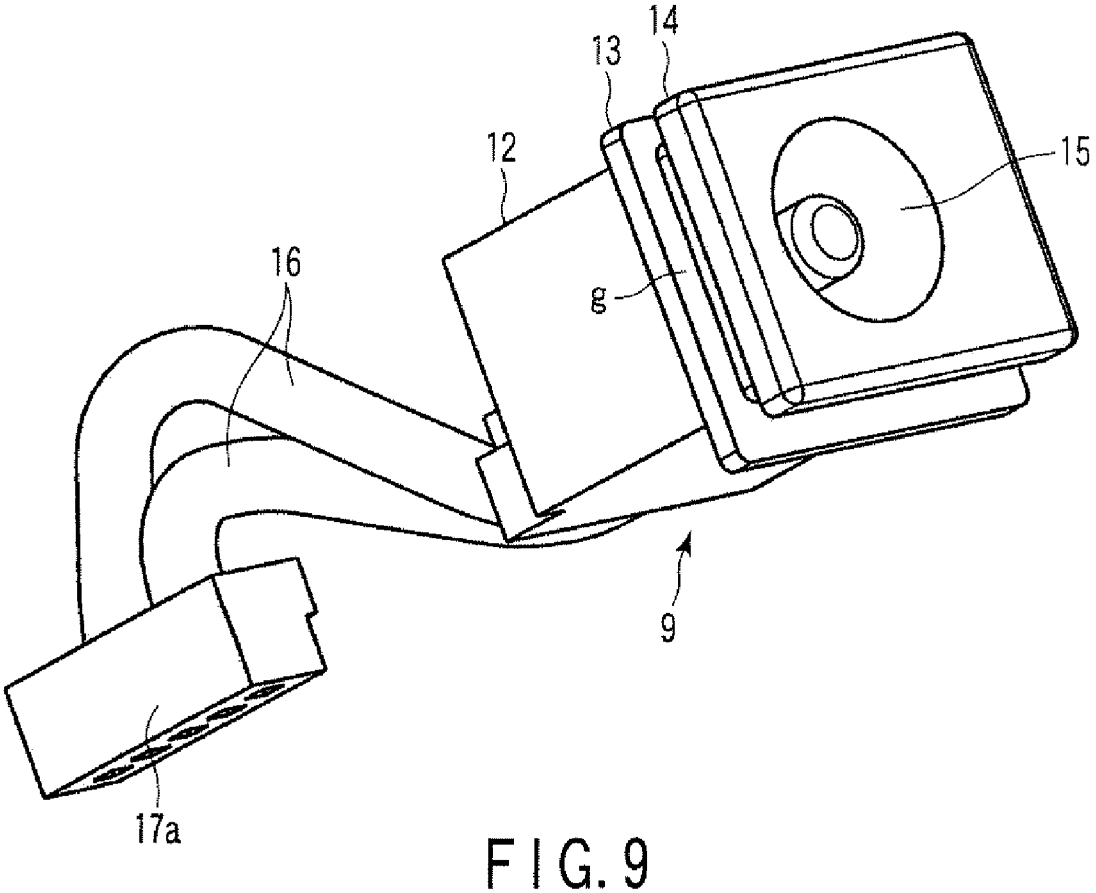
FIG. 9 is an exemplary perspective view of a power supply connector.

FIG. 9 is a perspective view illustrating the power supply connector 9, which is connected to an external power supply, in a three-dimensional manner. As illustrated in FIG. 9, the power supply connector 9 has a box-shaped connector main body 12, a rear flange 13, a front flange 14, a plug insertion hole 15, and two cables 16.

The rear flange 13 and the front flange 14 are formed on the peripheral surface of the connector main body 12, and project from the connector main body 12. The front flange 14 is located at a front end of the connector main body 12, and opposed to the rear flange 13. A gap g is formed between the rear flange 13 and the front flange 14.

The cables 16 are drawn from the rear end of the connector main body 12. The cables 16 have elasticity and flexibility. A first interface connector 17*a* is connected to a drawing end of the cables 16. The first interface connector 17*a* is connected to a second interface connector 17*b* mounted on the printed circuit board 8. Therefore, the power supply connector 9 is electrically connected to the printed circuit board 8 through the first and the second interface connectors 17*a* and 17*b*, before the printed circuit board 8 is contained between the cover 2 and the base 3.

In addition, an expansion connector 18 is mounted on the printed circuit board 8. The expansion connector 18 functions as an interface used when a portable computer (not shown) is connected to the docking station 1. The expansion connector 18 pierces through the shield cover 6 and the cover 2, and projects from an upper surface of the cover 2.

Next, a structure of fixing the power supply connector 9 to the base 3 is explained in detail.

Figure 6:
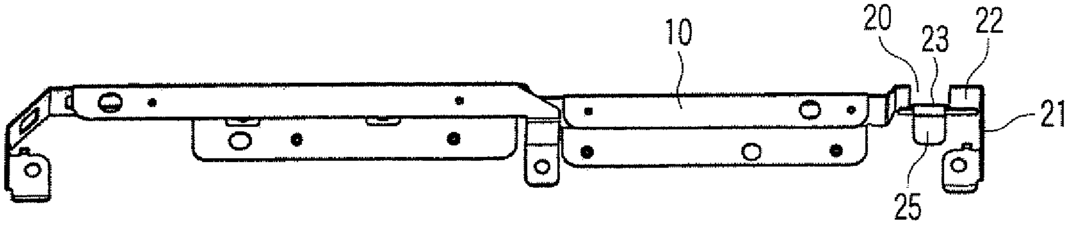
FIG. 6 is an exemplary perspective view of a connector panel of the PCB assembly.
Figure 7:
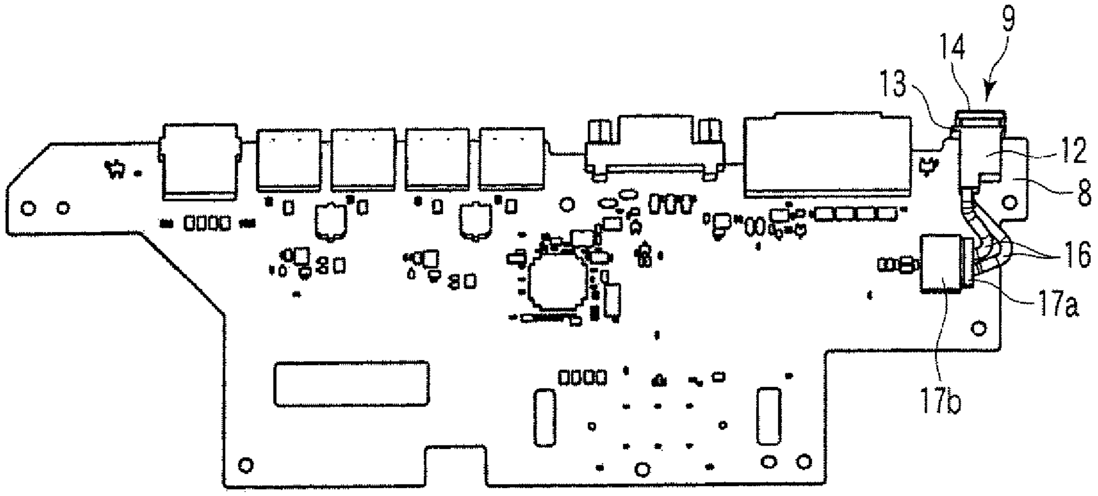
FIG. 7 is an exemplary plan view of a printed circuit board of the PCB assembly.
Figure 8:
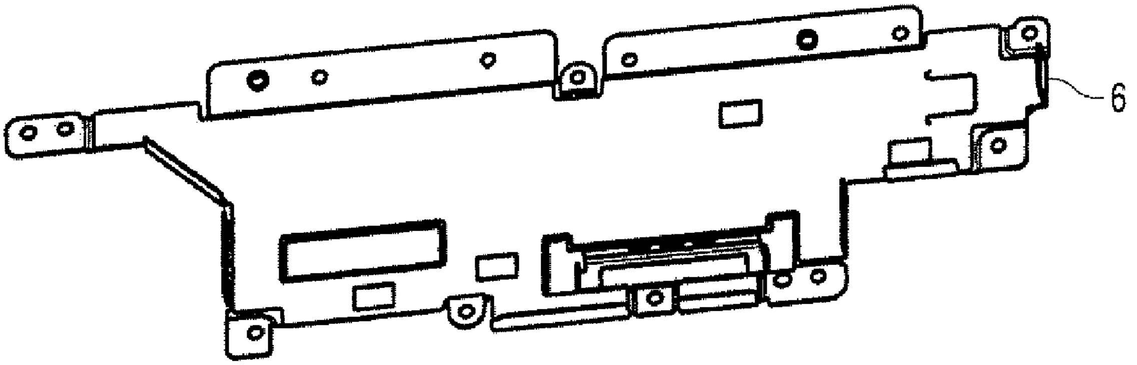
FIG. 8 is an exemplary perspective view of a shield cover of the PCB assembly.
Figure 10:
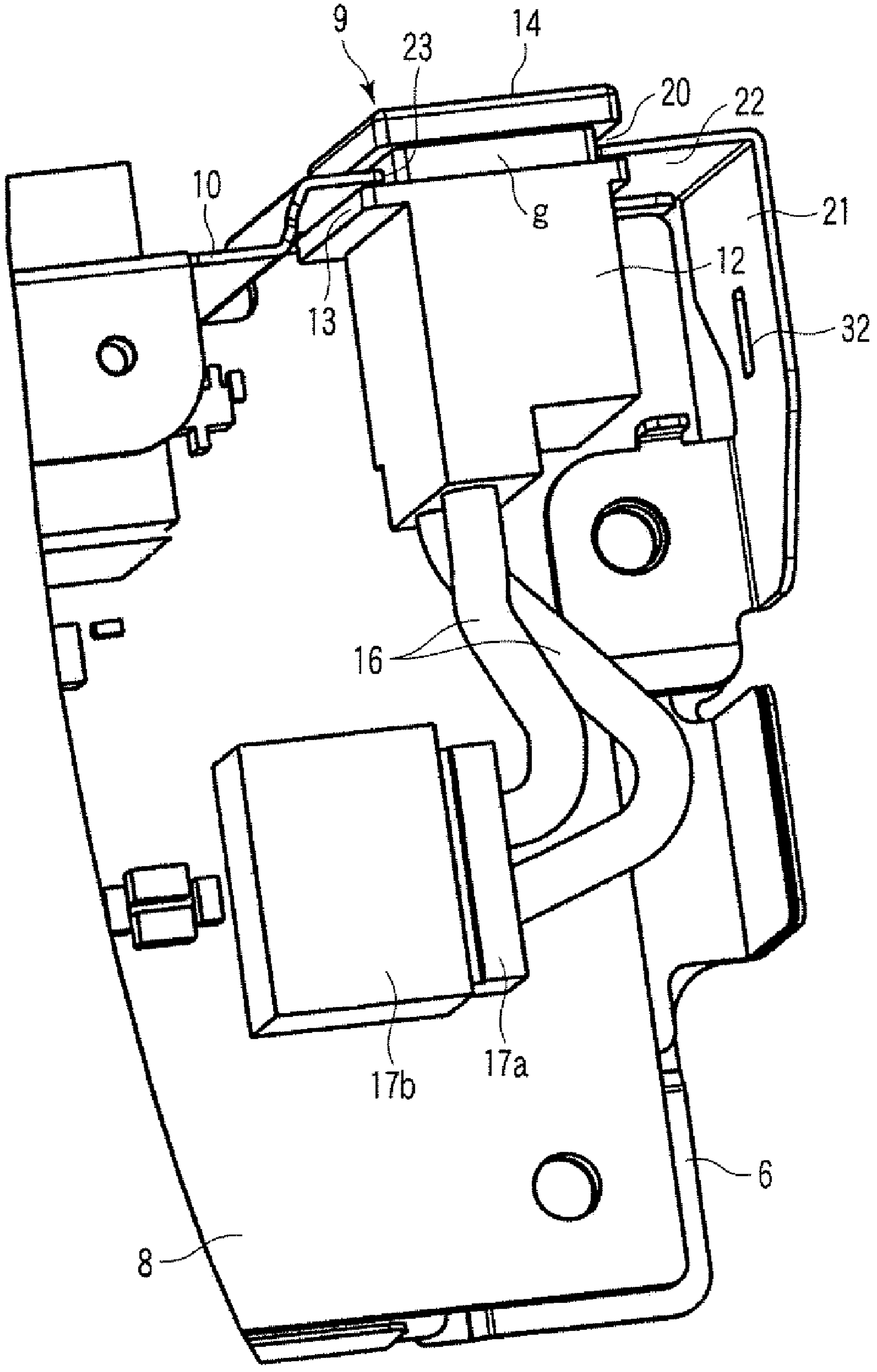
FIG. 10 is an exemplary perspective view illustrating a state where the power supply connector is inserted into a cutoff portion of the connector panel.

FIG. 10 is a perspective view illustrating a positional relationship between the power supply connector 9 and the connector panel 10 in a three-dimensional manner. As illustrated in FIGS. 6 and 10, a first provisional fixing portion 20 is provided in the connector panel 10. A sidewall 21 and a rear wall 22 are formed at one end of the connector panel 10.

A rectangular cutoff portion 23 is formed at a lower end of the rear wall 22 of the connector panel 10. The cutoff portion 23 is located in the vicinity of the sidewall 21. The width of the cutoff portion 23 is substantially equal to the width of the connector main body 12 of the power supply connector 9. The depth of the cutoff portion 23 is substantially equal to the height of the connector main body 12 of the power supply connector 9. The rear wall 22 and the cutoff portion 23 form the first provisional fixing portion 20.

A portion of the gap g of the power supply connector 9 between the rear flange 13 and the front flange 14 is inserted into the cutoff portion 23. By this insertion, the connector main body 12 is held from the right and the left, and the right side portion and the left side portion of the connector main body 12 are fixed in the first provisional fixing portion 20. Simultaneously, frontward and backward movements of the right and left side portions of the connector main body 12 are restricted by the front flange 14, the rear flange 13, and the rear wall 22.

The gap g between the front flange 14 and the rear flange 13 is larger than the thickness of the rear wall 22. Therefore, the power supply connector 9 is movable in the forward and backward directions of the rear wall 22 within a limited range.

Further, as illustrated in FIG. 6, a stepped support piece 25 is provided in the bottom of the cutoff portion 23. The support piece 25 extends from the rear wall 22 toward the inside of the connector panel 10.

The support piece 25 supports the rear flange 13 and the connector main body 12 of the power supply connector 9 fixed in the first provisional fixing portion 20.

Figure 5:
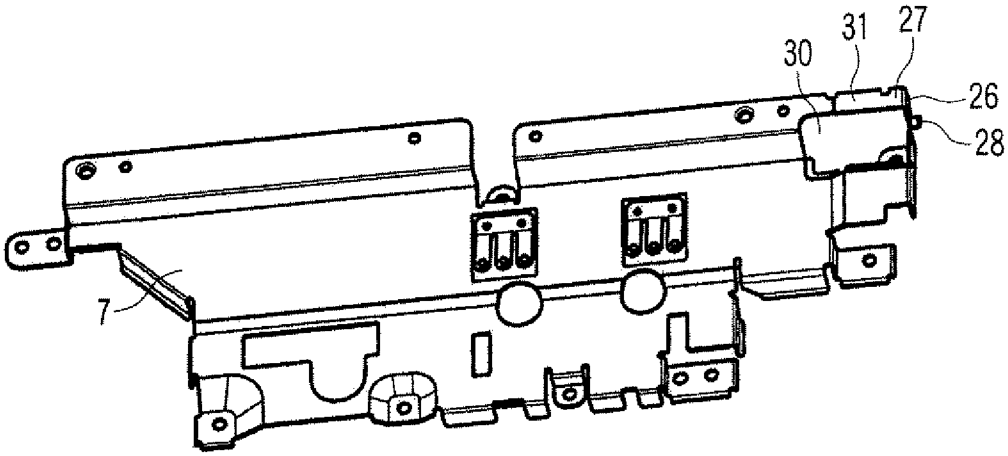
FIG. 5 is an exemplary perspective view of a shield base of the PCB assembly, as viewed from the bottom.
Figure 11:
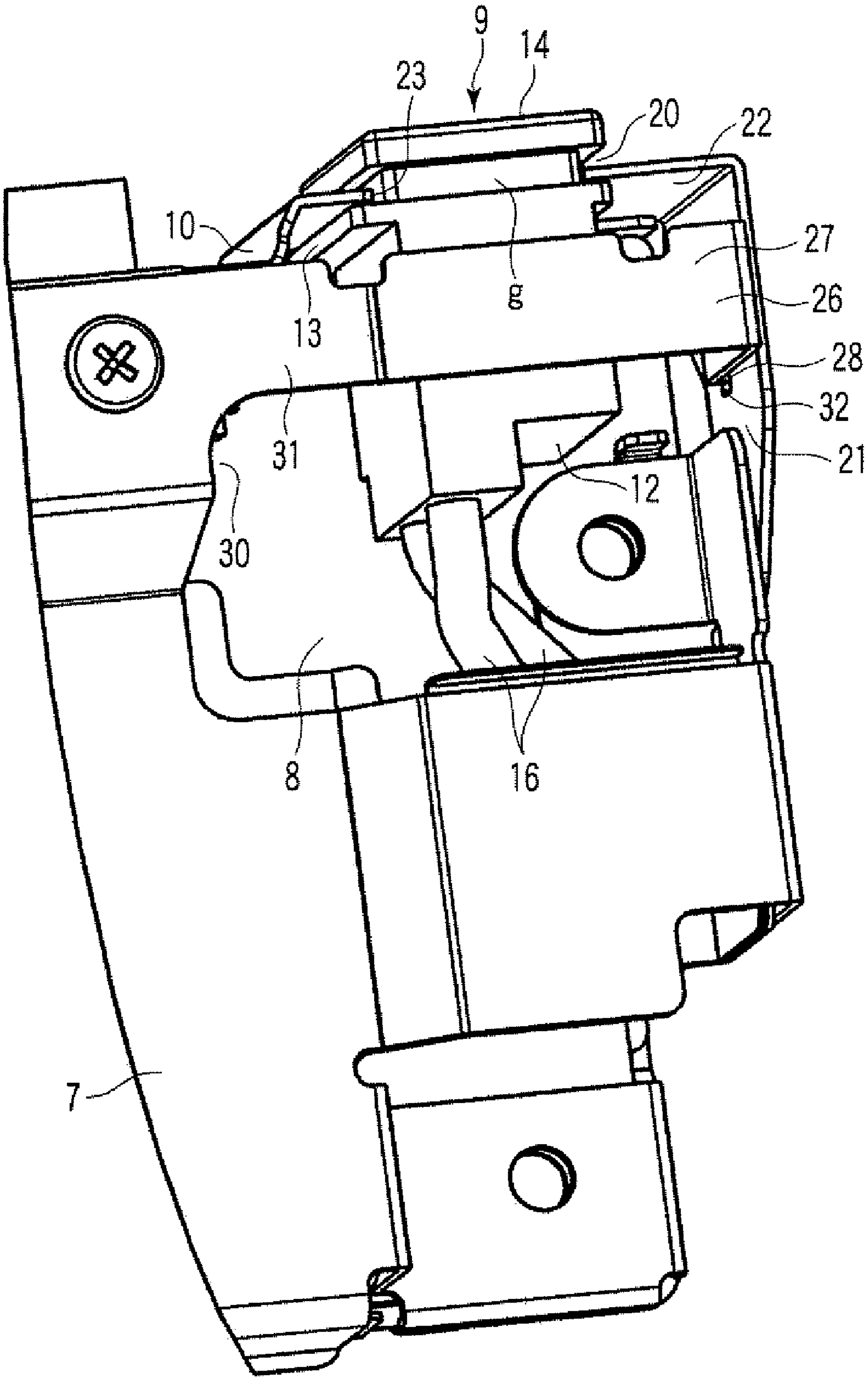
FIG. 11 is an exemplary perspective view illustrating a state where the power supply connector inserted into the cutoff portion of the connector panel is held down by a plate main body of the shield base.

FIG. 11 is a perspective view illustrating a positional relationship between the power supply connector 9, which is fixed in the first provisional fixing portion 20 of the connector panel 10, and the shield base 7 in a three-dimensional manner. As illustrated in FIGS. 5 and 11, a second provisional fixing portion 26 is provided the shield base 7. The second provisional fixing portion 26 has an L-shaped plate main body 27 and an outward hook 28. The plate main body 27 and the hook 28 are formed on the shield base 7.

A corner portion of the shield base 7 corresponding to the power supply connector 9 is cut away to form a substantially rectangular gap 30 through which the power supply connector 9 passes. A projecting end portion 31 of the shield base 7 crosses over the gap 30 and extends to the end portion of the shield base 7, and extends vertically downward. Thereby, the L-shaped plate main body 27 is formed.

The outward hook 28 is formed at an end portion of the plate main body 27. The hook 28 is opposed to the sidewall 21 of the connector panel 10. A lock hole 32 is formed in the sidewall 21. The hook 28 is engaged with the lock hole 32.

Further, as illustrated in FIG. 11, the shield base 7 covers a part of the cables 16 located on the printed circuit board 8, and a connecting portion between the first interface connector 17*a* and the second interface connector 17*b*.

Figure 12:
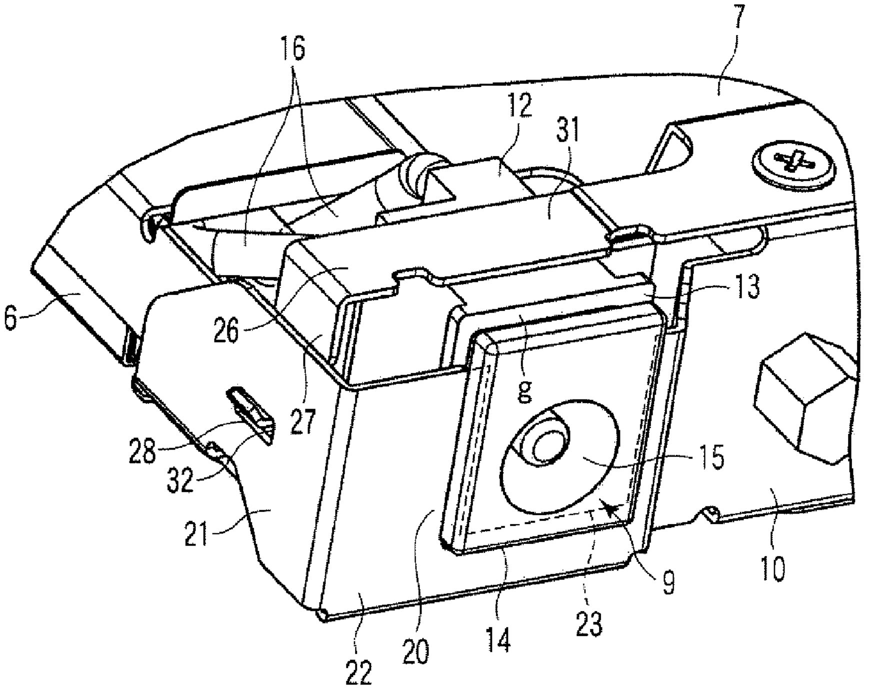
FIG. 12 is an exemplary another perspective view illustrating the state where the power supply connector inserted into the cutoff portion of the connector panel is held down by the plate main body of the shield base.

FIG. 12 is a perspective view illustrating a state where the power supply connector 9 is fixed in the first provisional fixing portion 20 of the connector panel 10 and the second provisional fixing portion 26 of the shield base 7, in a three-dimensional manner. As illustrated in FIG. 12, when the shield base 7 is fitted with the connector panel 10 and the printed circuit board 8, the hook 28 is engaged with the lock hole 32. Thereby, the power supply connector 9 is held and fixed from above and below between the second provisional fixing portion 26 and the support piece 25.

Figure 13:
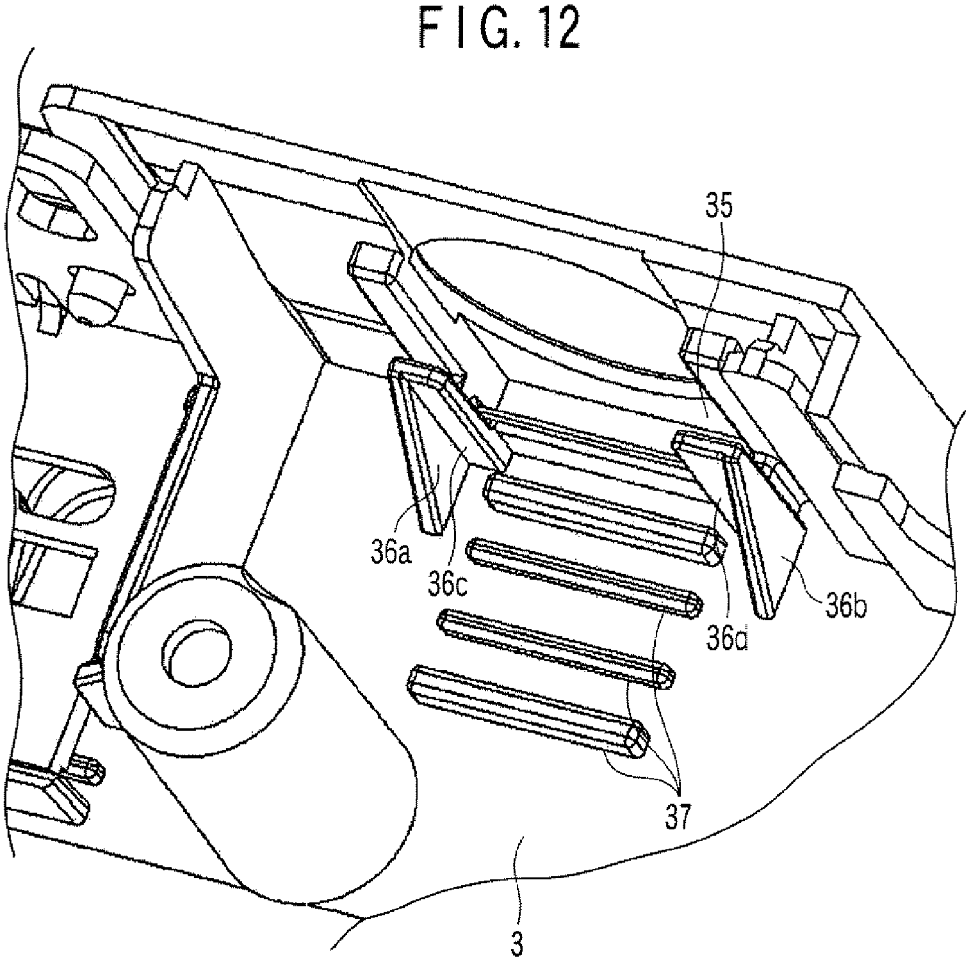
FIG. 13 is an exemplary perspective view of the base having right-angled triangular ribs and rectangular ribs.

FIG. 13 is a perspective view illustrating a local portion of the base 3 in a three-dimensional manner. As illustrated in FIG. 13, a fixing portion 35 is formed in a position of the base 3 corresponding to the power supply connector 9. The fixing portion 35 has a pair of right-angled triangular ribs 36*a* and 36*b*, and a pair of rectangular ribs 36*c* and 36*d*. The right-angled triangular ribs 36*a* and 36*b* are united with the respective rectangular ribs 36*c* and 36*d* to reinforce the respective rectangular ribs 36*c* and 36*d*, and form separate corner ribs.

The right-angled triangular ribs 36*a* and 36*b* are provided away from each other in the right and left directions of the docking station 1, and opposed to each other. An end portion of the power supply connector 9 having the rear flange 13 and the front flange 14 can pass through a space between the right-angled triangular ribs 36*a* and 36*b*. The rectangular ribs 36*c* and 36*d* are arranged in a line with an interval, between the right-angled triangular ribs 36*a* and 36*b*. A space between the rectangular ribs 36*c* and 36*d* is broader than the width of the connector main body 12 of the power supply connector 9. The thickness of the rectangular ribs 36*c* and 36*d* becomes gradually larger from the distal ends of the rectangular ribs 36*c* and 36*d* toward the bottom.

In addition, a plurality of bar-shaped support portions 37 are formed on the internal surface of the base 3. The support portions 37 project from the internal surface of the base 3 between the right-angled triangular ribs 36*a* and 36*b*, to support the connector main body 12 of the power supply connector 9.

Figure 14:
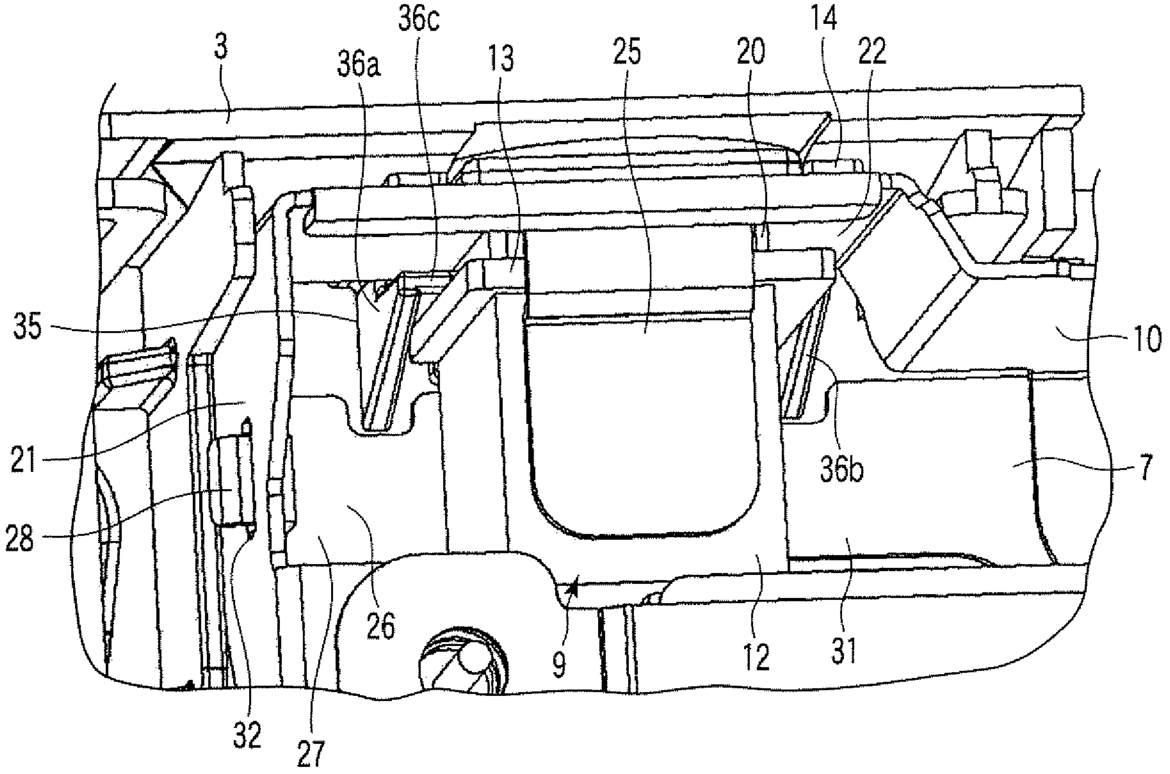
FIG. 14 is an exemplary perspective view illustrating a state where the power supply connector of the PCB assembly is fixed to the base.
Figure 15:
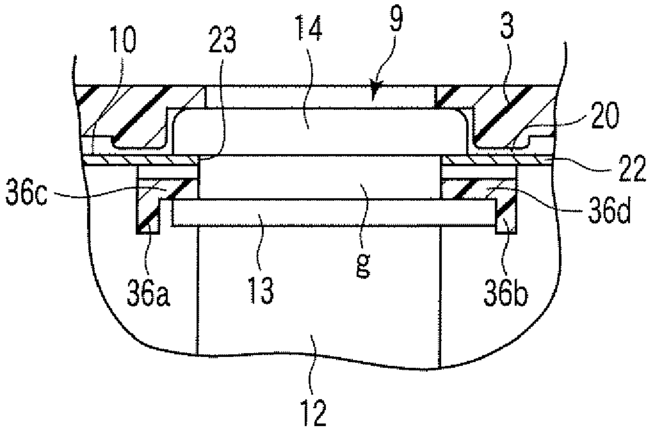
FIG. 15 is an exemplary cross-sectional view illustrating the state where the power supply connector is fixed to the base.

FIG. 14 is a perspective view illustrating, in a three-dimensional manner, a state where the power supply connector 9 is fixed to the base 3 by the first provisional fixing portion 20 of the connector panel 10, the second provisional fixing portion 26 of the shield base 7, and the fixing portion 35 of the base 3. As illustrated in FIG. 14, when the PCB assembly 5 is attached to the base 3, the rectangular ribs 36*c* and 36*d* interpose like wedges between the rear flange 13 of the power supply connector 9 and the rear wall 22 of the connector panel 10. Since each of the rectangular ribs 36*c* and 36*d* has a narrower distal end and a wider bottom, the rectangular ribs 36*c* and 36*d* abut the rear flange 13. Thereby, a force pressing the front flange 14 of the power supply connector 9 against the rear wall 22 is applied to the connector 9.

When the rectangular ribs 36*c* and 36*d* completely interpose between the rear flange 13 and the rear wall 22, a gap is formed between the distal end of each of the rectangular ribs 36*c* and 36*d* and the rear wall 22. Therefore, the power supply connector 9 is fixed to the base 3 by the fixing portion 35.

Before the PCB assembly 5 is fixed to the base 3, the power supply connector 9 is provisionally fixed to the PCB assembly 5 by the first and the second provisional fixing portions 20 and 26. Specifically, the left side portion, the right side portion, the upper portion and the lower portion of the power supply connector 9 are fixed in the first and the second provisional fixing portions 20 and 26. Besides, forward and backward movements of the power supply connector 9 are restricted by the front flange 14, the rear flange 13, and the rear wall 22.

Therefore, the power supply connector 9 can be easily fixed to the base 3, and stability of connection of the power supply connector 9 and reliability of the connection end thereof can be secured.

The rectangular ribs 36*c* and 36*d* of the fixing portion 35 become gradually thicker from the distal end toward the bottom. Therefore, the rectangular ribs 36*c* and 36*d* can easily interpose between the rear flange 13 of the connector main body 12 and the rear wall 22 of the connector panel 10.

At that point in time when the rectangular ribs 36*c* and 36*d* completely interpose between the rear flange 13 and the rear wall 22, the rectangular ribs 36*c* and 36*d* abut the rear flange 13. As a result, a force in a direction of abutting the front flange 14 against the rear wall 22 of the connector panel 10 is applied to the connector main body 12. Thereby, the power supply connector 9 is securely fixed to the base 3, without moving forward or backward with respect to the base 3. Therefore, forward and backward movements of the power supply connector 9 are restricted, and stable connection of the power supply plug to the power supply connector 9 is ensured.

The above preferred embodiment describes only a fixing structure of the fixing connector 9 to which a power supply plug is connected. However, the present invention is not limited to it. The connector fixing structure according to the present invention can also be used for fixing connectors such as RJ11, RJ45 and other connectors of the same type having similar box-shaped structures.

In the above preferred embodiment, the first provisional fixing portion 20 is defined by the rectangular cutoff portion 23 provided in the rear wall 22 of the connector panel 10, and the cutoff portion 23 is located in the vicinity of the sidewall 21. However, the present invention is not limited to this structure. Since the power supply connector 9 can be placed in various positions, the cutoff portion 23 can be formed in any desired position in the rear wall 22 of the connector panel 10, in correspondence with the position where the power supply connector 9 is placed. Further, the cutoff portion 23 can be formed at an upper end of the rear wall 22.

The first provisional fixing portion 20 is not necessarily provided in the connector panel 10. For example, a member which provisionally fixes the power supply connector 9 on the right and the left sides of the power supply connector 9 can be independently provided on the printed circuit board 8. Therefore, any changes or modifications concerning the PCB assembly 5 having the first provisional fixing portion 20 do not depart from the gist and the scope of the invention, as long as the first provisional fixing portion 20 can provisionally fix the power supply connector 9 on the right and the left sides of the power supply connector 9.

In the above preferred embodiment, the second provisional fixing portion 26 is configured to have the L-shaped plate main body 27, and the hook 28 engaged with the lock hole 32 of the connector panel 10. However, the present invention is not limited to this structure. For example, the L-shaped plate main body 27 may be connected with the sidewall 21 of the connector panel 10 by screws. In addition, the plate main body 27 may be replaced by a holding plate having sufficient strength. Thereby, the hook 28 and the lock hole 32 can be eliminated from the second provisional fixing portion 26.

The fixing structure for the power supply connector 9 by the second provisional fixing portion 26 can be further simplified by providing a closing member on the opening end of the cutoff portion 23. Therefore, any changes or modifications concerning the PCB assembly 5 having the second provisional fixing portion 26 do not depart from the gist and the scope of the invention, as long as the second provisional fixing portion 26 can provisionally fix the power supply connector 9 by holding the power supply connector 9 therebetween from above and below.

According to the above preferred embodiment, the fixing portion 35 has the right-angled triangular ribs 36*a* and 36*b* and the rectangular ribs 36*c* and 36*d*, which are provided on the base 3. However, the present invention is not limited to this structure. The right-angled triangular ribs 36*a* and 36*b* may be eliminated, as long as the rectangular ribs 36*c* and 36*d* have sufficient strength.

In addition, the fixing portion 35 is not necessarily provided on the base 3, but may be provided on the top cover 2. Besides, constituent elements forming the fixing portion 35 are not limited to ribs.

The above embodiment describes the fixing structure using the rectangular ribs 36*c* and 36*d*, which are interposed between the rear wall 22 of the connector panel 10 and the rear flange 13 of the power supply connector 9. However, the present invention is not limited to this structure. For example, any desired structure for fixing the power supply connector 9 to the base 3 to prevent forward and backward movements of the power supply connector 9 may be provided behind the rear flange 13. Therefore, any changes or modifications concerning the fixing portion 35 do not depart from the gist and the scope of the invention, as long as the fixing portion 35 can fix the power supply connector 9 by holding the power supply connector 9 from the front and the rear.

Further, other provisional fixing members of other forms may be provided only on the PCB assembly 5, or only simple provisional fixing members may be provided on the PCB assembly 5. Any structures do not depart from the gist or the scope of the invention, as long as provisional fixing members is provided on the PCB assembly 5 and various fixing structures which have the function of fixing the power supply connector 9 to the base 3 are provided.

Next, a method of fixing a connector fixing structure according to the present invention is explained below.

The fixing method includes provisionally fixing the power supply connector 9 to the PCB assembly 5 of the docking station 1, and fixing the power supply connector 9 to the base 3 of the docking station 1. The fixing method of the power supply connector 9 is performed in the process of assembling the docking station 1. The detailed process of assembling the docking station 1 is as follows.

In Step 1, the connector panel 10 is fitted with the printed circuit board 8, during which the power supply connector 9 is connected to the printed circuit board 8.

In Step 2, the shield cover 6 is fitted with the printed circuit board 8 and the connector panel 10.

In Step 3, a portion of the gap g of the connector main body 12 of the power supply connector 9, which is located between the rear flange 13 and the front flange 14, is inserted into the cutoff portion 23 of the connector panel 10, and thereby the left side portion and the right side portion of the power supply connector 9 is provisionally fixed to the connector panel 10.

In Step 4, the shield base 7 is fitted with the printed circuit board 8 and the connector panel 10, and the hook 28 of the shield base 7 is engaged with the lock hole 32 of the connector panel 10. Thereby, assembly of the PCB assembly 5 is completed.

In Step 5, the rectangular ribs 36*c* and 36*d* formed on the base 3 are interposed between the rear flange 13 of the power supply connector 9 and the rear wall 22 of the connector panel 10, to restrict forward and backward movements of the power supply connector 9. The rectangular ribs 36*c* and 36*d* are brought into contact with the rear flange 13 of the power supply connector 9, and thereby the rear wall 22 of the connector panel 10 is brought into contact with the front flange 14 of the power supply connector 9.

In Step 6, the top cover 2 is attached to the base 3. Thereby, assembly of the docking station 1 is completed.

The above preferred embodiment is only description of a typical embodiment of the present invention, and should not be Interpreted as limitations of the present invention. The fixing structure and the fixing method according to the present invention are not limited only to the description of the above embodiment. The work of fixing the power supply connector 9 to the base 3 can be easily performed, as long as the step of provisionally fixing the power supply connector 9 to the PCB assembly 5 is performed before the power supply connector 9 is fixed to the base 3, or the provisional fixing members are provided in the PCB assembly 5.

Therefore, various changes and modifications of the above fixing structure and the fixing method do not depart from the gist or the scope of the invention.

While certain embodiments of the inventions have been described, there embodiments have been presented by way of example only, and are not intended to limit the scope of the invention. Indeed, the novel methods and systems described herein may be embodied in a variety of other forms; furthermore various omissions, substitutions and changes in the form of the methods and systems described herein may be made without departing from the spirit of the inventions. The accompanying claims and their equivalents are intended to cover such form or modifications as would fall within the scope and spirit of the inventions.

What is claimed is:

1. A connector fixing structure comprising:

a printed circuit board assembly having a connector mounted on a printed circuit board, and a connector panel attached to the printed circuit board; and a base to which the printed circuit board assembly is attached, wherein the connector has a connector main body, a front flange projecting from a peripheral surface of the connector main body, and a rear flange projecting from the peripheral surface of the connector main body and being opposed to the front flange, the connector panel has a provisional fixing portion which is inserted between the front flange and the rear flange and provisionally fixes the connector to the connector panel, and the base has a fixing portion which is inserted between the rear flange and the connector panel, thereby brings the front flange into contact with the connector panel and fixes the connector to the base, when the printed circuit board assembly is attached to the base.

2. A connector fixing structure according to claim 1, wherein the printed circuit board assembly includes a shield base which is attached to the printed circuit board together with the connector panel, the provisional fixing portion includes a first provisional fixing portion which holds and fixes the connector from the right and the left, and a second provisional fixing portion which holds and fixes the connector from above and below, the first provisional fixing portion is provided in the connector panel, and the second provisional fixing portion is provided in the shield base.

3. A connector fixing structure according to claim 2, wherein the fixing portion fixes the connector such that the connector is immovable in forward and backward directions of the base.

4. A connector fixing structure according to claim 3, wherein the first provisional fixing portion has a cutoff portion, into which a portion of the connector main body between the front flange and the rear flange is inserted.

5. A connector fixing structure according to claim 3, wherein the connector panel has a rear wall in which the cutoff portion is formed, and a sidewall adjacent to the rear wall.

6. A connector fixing structure according to claim 5, wherein the rear wall of the connector panel has a support piece projecting from a position of the cutoff portion, and the connector main body is supported on the support piece.

7. A connector fixing structure according to claim 6, wherein the second provisional fixing portion has a plate main body which is formed in the shield base, and a hook which is formed at an end portion of the plate main body and engaged with the sidewall of the connector panel, and the connector is held and fixed from above and below between the plate main body and the support piece by engaging the hook with the sidewall.

8. A connector fixing structure according to claim 7, wherein the fixing portion has a pair of first ribs projecting from the base, the first ribs are arranged with an interval which is larger than width of the connector main body, and thickness of each of the first ribs becomes gradually larger from a distal end toward a bottom thereof.

9. A connector fixing structure according to claim 8, wherein the fixing portion has a pair of second ribs which reinforce the respective first ribs.

10. A connector fixing structure according to claim 9, wherein the base has a plurality of bar-shaped support portions which support the connector main body.

11. A connector fixing structure comprising:

a printed circuit board assembly having a connector mounted on a printed circuit board, and a connector panel attached to the printed circuit board, the connector having a connector main body, a front flange which projects from a peripheral surface of the connector main body, a rear flange which projects from the peripheral surface of the connector main body and is opposed to the front flange, and a cable which is drawn from the connector main body and connected to the printed circuit board, in which a connecting portion between the cable and the printed circuit board is covered with a shield base; and a base to which the printed circuit board assembly is attached;

a provisional fixing portion which is provided in the connector panel, inserted between the front flange and the rear flange of the connector and provisionally fixes the connector to the connector panel; and a fixing portion which is provided in the base, and inserted between the rear flange and the connector panel, thereby brings the front flange into contact with the connector panel and fixes the connector to the base, when the printed circuit board assembly is attached to the base.

12. A connector fixing structure according to claim 11, wherein the printed circuit board assembly is attached to the base, in a state where connection of the cable of the connector with the printed circuit board is completed.

13. An electronic apparatus comprising:

a base; and a printed circuit board assembly attached to the base, wherein the printed circuit board assembly has a connector mounted on a printed circuit board, and a connector panel attached to the printed circuit board, the connector has a connector main body, a front flange projecting from a peripheral surface of the connector main body, and a rear flange projecting from the peripheral surface of the connector main body and being opposed to the front flange, the connector panel has a provisional fixing portion which is inserted between the front flange and the rear flange and provisionally fixes the connector to the connector panel, and the base has a fixing portion which is inserted between the rear flange and the connector panel, thereby brings the front flange into contact with the connector panel and fixes the connector to the base, when the printed circuit board assembly is attached to the base.

14. An electronic apparatus according to claim 13, wherein the printed circuit board assembly includes a shield base which is attached to the printed circuit board together with the connector panel, the provisional fixing portion includes a first provisional fixing portion which holds and fixes the connector from the right and the left, and a second provisional fixing portion which holds and fixes the connector from above and below, the first provisional fixing portion is provided in the connector panel, and the second provisional fixing portion is provided in the shield base.

15. An electronic apparatus according to claim 14, wherein the fixing portion has a pair of first ribs projecting from the base, the first ribs are arranged with an interval which is larger than width of the connector main body, and thickness of each of the first ribs becomes gradually larger from a distal end toward a bottom thereof.

16. An electronic apparatus according to claim 15, wherein the fixing portion has a pair of second ribs which reinforce the respective first ribs.

17. An electronic apparatus according to claim 16, wherein the connector has a cable which is connected to the printed circuit board, and a connecting portion between the cable and the printed circuit board is covered with the shield base.

18. An electronic apparatus according to claim 16, wherein the printed circuit board assembly is attached to the base, in a state where connection of the cable of the connector with the printed circuit board is completed.

* * * * *